United States Patent [19]
Ueda

[11] Patent Number: 5,917,728
[45] Date of Patent: Jun. 29, 1999

[54] METHOD FOR DESIGNING PATH TRANSISTOR LOGIC CIRCUIT

[75] Inventor: Masahiko Ueda, Takatsuki, Japan

[73] Assignee: Matsushita Electric Industrial Co., Ltd., Kadoma, Japan

[21] Appl. No.: 08/686,375

[22] Filed: Jul. 25, 1996

[30] Foreign Application Priority Data

Jul. 26, 1995 [JP] Japan ..................................... 7-190152

[51] Int. Cl.[6] ............................. G06F 17/00; G06F 17/50
[52] U.S. Cl. ........................... 364/490; 364/488; 364/489
[58] Field of Search .................................... 364/488–491, 364/578; 395/500

[56] References Cited

U.S. PATENT DOCUMENTS

| | | | |
|---|---|---|---|
| 5,210,699 | 5/1993 | Harrington | 364/488 |
| 5,469,367 | 11/1995 | Puri et al. | 364/489 |

OTHER PUBLICATIONS

Yano et al, IEEE 1994 Custom Integrated Circuits Conf., pp. 603–606, 1994, "Lean Integration: Achieving a Quantum Leap in Performance and Cost . . . "

Malik et al, IEEE Proc. ICCAD '88. pp. 6–9, 1988, "Logic Verification Using Binary Decision Diagrams in a Logic Synthesis Environment."

Tsui et al; 30th ACM/IEEE Design Automation Conf., pp. 68–73, 1993, "Technology Decomposition and Mapping Targeting Low Power Dissipation."

Friedman et al. IEEE Transactions on Computers, vol. 39, No. 5, pp. 710–713, 1990, "Finding the Optimal Variable Ordering for Binary Decision Diagrams."

Berman et al. "Efficient Techniques for Timing Correction," IEEE, 1990, pp. 415–419.

Akita et al. "A Method for Reducing Power Consumption of CMOS Logic Based on Signal Transition Probability," IEEE, 1994, pp. 420–424.

Yano et al. "Lean Integration: Achieving a Quantum Leap in Performance and Cost of Logic LSIS," IEEE, 1994, pp. 603–606.

Tsui et al. "Technology Decomposition and Mapping Targeting Low Power Dissipation," IEEE, 1993, pp. 68–73.

*Primary Examiner*—Kevin J. Teska
*Assistant Examiner*—Vuthe Siek
*Attorney, Agent, or Firm*—Renner, Otto, Boisselle & Sklar, P.L.L.

[57] ABSTRACT

A method for designing a path transistor logic circuit based on a logic specification of a given circuit according to the present invention includes the steps of: generating a logic circuit including logic gates based on the logic specification, the logic circuit receiving input signals; evaluating signal transition probability of each of the input signals of the logic circuit; arranging the input signals of the logic circuit in a descending order of signal transition probability; generating a binary decision diagram corresponding to the logic circuit by applying Shannon expansion to the logic circuit in accordance with the descending order of signal transition probability, the binary decision diagram including nodes; and replacing each of the nodes of the binary decision diagram with a two-input selector circuit including a path transistor so as to obtain the path transistor logic circuit.

8 Claims, 18 Drawing Sheets

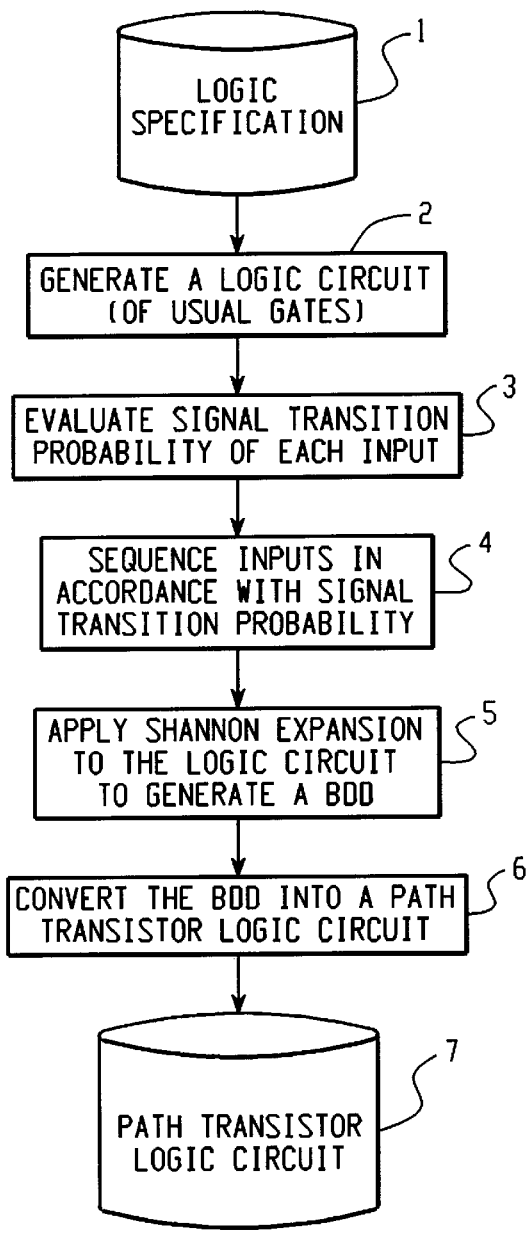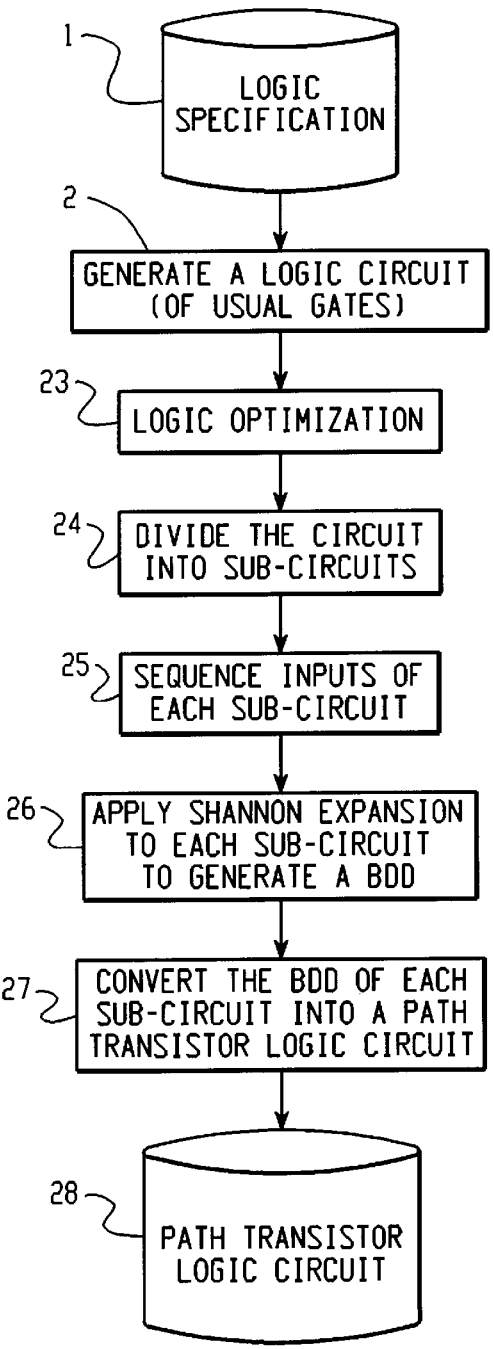
Fig. 1
Fig. 3

```
module adder4 ( a, b, y);

input [3:0] a, b;
  output [3:0] y;

assign y = a + b;

endmodule
```

| ORDER | INPUT SIGNAL | SIGNAL TRANSITION PROBABILITY |
|---|---|---|
| 1 | a0 | 0.74 |
| 2 | b0 | 0.68 |
| 3 | a1 | 0.47 |
| 4 | b1 | 0.42 |
| 5 | a2 | 0.25 |
| 6 | b2 | 0.18 |
| 7 | a3 | 0.11 |
| 8 | b3 | 0.09 |

Fig. 8 delay (a0 —> y3) < 2.0 nsec
delay (b0 —> y3) < 1.5 nsec

| ORDER | INPUT SIGNAL | CONSTRAINTS REGARDING NUMBER OF STAGES |
|---|---|---|
| 1 | b 3 | ------------- |
| 2 | a 3 | ------------- |
| 3 | b 0 | < 3 |
| 4 | a 0 | < 5 |
| 5 | b 2 | ------------- |
| 6 | a 2 | ------------- |
| 7 | b 1 | ------------- |
| 8 | a 1 | ------------- |

Fig. 15

| ORDER | i | y 3 |
|---|---|---|
| 1 | b 1 | b 3 |
| 2 | a 1 | a 3 |
| 3 | b 0 | b 2 |
| 4 | a 0 | a 2 |
| 5 |  | i |

Fig. 18 delay (a3 —> y3) < 1.2 nsec
delay (b3 —> y3) < 1.7 nsec

Fig. 24

| ORDER | INPUT SIGNAL | SIGNAL TRANSITION PROBABILITY | CONSTRAINTS REGARDING THE NUMBER OF STAGES |
|---|---|---|---|
| 1 | a 0 | 0.74 | ------------- |
| 2 | b 0 | 0.68 | ------------- |
| 3 | a 3 | 0.11 | < 3 |
| 4 | b 3 | 0.09 | < 4 |
| 5 | a 1 | 0.47 | ------------- |
| 6 | b 1 | 0.42 | ------------- |
| 7 | a 2 | 0.25 | ------------- |
| 8 | b 2 | 0.18 | ------------- |

Fig. 25

(INTERNAL VARIABLE i)

| ORDER | INPUT SIGNAL | CONSTRAINTS REGARDING THE NUMBER OF STAGES |
|---|---|---|
| 1 | b 0 | < 1 |
| 2 | a 0 | < 3 |
| 3 | b 1 | ------------- |
| 4 | a 1 | ------------- |

(OUTPUT y3)

| ORDER | INPUT SIGNAL | CONSTRAINTS REGARDING THE NUMBER OF STAGES |
|---|---|---|
| 1 | i | < 2 |
| 2 | b 3 | ------------- |
| 3 | a 3 | ------------- |
| 4 | b 2 | ------------- |
| 5 | a 2 | ------------- |

*Fig. 26*

METHOD FOR DESIGNING PATH TRANSISTOR LOGIC CIRCUIT

BACKGROUND OF THE INVENTION

1. Field of the Invention:

The present invention relates to an automated designing technique for efficiently designing a circuit, e.g., a large scale integrated circuit (LSI). In particular, the present invention relates to a logic design method for generating a path transistor logic circuit based on functional descriptions of the circuit at a stage independent of a process-technology.

2. Description of the Related Art:

In recent years, path transistor logic has attracted much attention as alternative logic to replace CMOS logic, which has widely been in use. Path transistor logic has advantages such as high speed, small power consumption, and small area of the circuit, as compared with CMOS logic.

On the other hand, in order to counterbalance the increased number of design steps required in the designing of LSIs of increasingly larger size, so-called top-down design methods have become prevalent, in which a desired LSI is functionally described using a hardware description language, and then a logic circuit thereof is automatically designed by using an automatic logic synthesis apparatus. The essence of the top-down design methods lies in an automatic logic synthesis technique based on a functional description. Therefore, automatic logic synthesis techniques based on functional descriptions have been vigorously studied to date.

In view of the current prevalence of the top-down design methods, it is essential to establish a technique for automatically designing path transistor logic, rather than manually designing the logic with a great deal of human attention. Otherwise, path transistor logic (although having such relatively advantageous characteristics compared to CMOS logic) may not become widely used but may only be used for particular species of circuits.

Thus, in order to realize high-performance and low-cost LSIs by utilizing the excellent characteristics of path transistor logic, it is essential to establish an automatic design method for path transistor logic.

A conventional path transistor logic design method is disclosed in, for example, "Lean Integration: Achieving a Quantum Leap in Performance and Cost of Logic LSIs" (IEEE 1994 Custom Integrated Circuits Conference).

Hereinafter, a flow of the design process described in the above literature will be described.

First, a binary decision diagram (BDD) is generated from a logic specification typically expressed in a hardware description language or the like.

Next, nodes in the above graph (diagram) are replaced by path transistors so as to form a transistor network.

Next, buffers are inserted in appropriate places in the network for restoring potential levels and amplifying currents.

Finally, previously-provided lean cells are assigned to the circuit thus generated, whereby a net list is output.

In the above design flow, the processes in the first two steps do not depend on any particular cell libraries (technology-independent processes), whereas the last two steps are technology-dependent processes.

The technology-dependent processes in the above-mentioned conventional path transistor logic design method have at least the following problems:

(1) Power consumption

Recent semiconductor IC integration technology allows more than several million transistors to be integrated in one chip. As a result, the problem of heating of LSIs has become a major issue. In addition, changing circumstances (such as the expansion of the market for mobile phones) require LSIs which consume less power. These issues also apply to path transistor logic, which consumes less power than CMOS logic does.

(2) Operation speed

Although path transistor logic is known to be generally faster than CMOS logic, the actual performance of a given circuit is often bottle-necked by delay occurring in a specific "critical path" in the circuit. Even if a given path transistor logic circuit operates faster than a typical CMOS circuit in a number of paths on average, the performance of the circuit may be substantially lowered by a large delay occurring in a critical path.

(3) Circuit scale

According to conventional path transistor design methods in which the nodes in the generated BDD are replaced by path transistors, the scale of the final circuit largely depends on the size of the BDD. The size of the BDD is known to be a function of the order in which signals are input to the Shannon expansion through which the BDD is generated. Therefore, in order to reduce the scale of the circuit, it is necessary to optimize the order in which signals are input to the Shannon expansion process. However, it is difficult to optimize the order of inputting signals to a Shannon expansion process. Currently, no optimization method Is known to be effective for more than 17 input signals.

On the other hand, more than a hundred input signals are often input to an actual circuit. Therefore, it is currently impossible to optimize the order of inputting signals to the Shannon expansion process for designing such a circuit. This results in a BDD which is larger than it can be (i.e., under the optimum order of input signals), thereby resulting in an unnecessarily large final circuit.

Moreover, there is no guarantee that converting the entire circuit into one integral BDD always provides the smallest circuit size.

SUMMARY OF THE INVENTION

A method for designing a path transistor logic circuit based on a logic specification of a given circuit according to the present invention includes the steps of: generating a logic circuit including logic gates based on the logic specification, the logic circuit receiving input signals; evaluating signal transition probability of each of the input signals of the logic circuit; arranging the input signals of the logic circuit in a descending order of signal transition probability; generating a binary decision diagram corresponding to the logic circuit by applying Shannon expansion to the logic circuit in accordance with the descending order of signal transition probability, the binary decision diagram including nodes; and replacing each of the nodes of the binary decision diagram with a two-input selector circuit including a path transistor so as to obtain the path transistor logic circuit.

In one embodiment of the invention, the method further includes the step of: calculating, based on a delay time constraint defining allowable delay time between input/output signals of the given circuit and on an average delay time of the path transistor logic circuit, a stage number constraint defining an allowable number of stages of the path transistor logic circuit, wherein the input signals of the logic circuit are arranged in view of the stage number constraint and the signal transition probability.

In another embodiment of the invention, the stage number constraint has a higher priority than the signal transition probability.

Alternatively, a method for designing a path transistor logic circuit based on a logic specification of a given circuit according to the present invention includes the steps of: generating a logic circuit including logic gates based on the logic specification, the logic circuit receiving input signals; calculating, based on a delay time constraint defining allowable delay time between input/output signals of the given circuit and on an average delay time of the path transistor logic circuit, a stage number constraint defining an allowable number of stages of the path transistor logic circuit; determining an order of input signals of the logic circuit for Shannon expansion in view of the stage number constraint; generating a binary decision diagram corresponding to the logic circuit by applying Shannon expansion to the logic circuit in accordance with the determined order of input signals, the binary decision diagram including nodes; and replacing each of the nodes of the binary decision diagram with a two-input selector circuit so as to obtain the path transistor logic circuit.

Alternatively, a method for designing a path transistor logic circuit based on a logic specification of a given circuit according to the present invention includes the steps of: generating a logic circuit including logic gates based on the logic specification, optimizing the logic circuit so as to eliminate redundant circuitry; dividing the optimized logic circuit into a plurality of sub-circuits in view of the number of input signals to each of the sub-circuits; determining an order of the input signals of each of the sub-circuits for Shannon expansion for purposes of minimizing a binary decision diagram to be generated; generating a binary decision diagram corresponding to the logic circuit by applying Shannon expansion to each of the sub-circuits in accordance with the determined order of input signals, the binary decision diagram including nodes; and replacing each of the nodes of the binary decision diagram with a two-input selector circuit so as to obtain the path transistor logic circuit.

In one embodiment of the invention, the method further Includes the step of: evaluating signal transition probability of each of the input signals of the respective sub-circuits, wherein the order of the input signals of each of the sub-circuits is determined based on the signal transition probability.

In another embodiment of the invention, the method further includes the step of: calculating, based on a delay time constraint defining allowable delay time between input/output signals of the given circuit and on an average delay time of the path transistor logic circuit, a stage number constraint defining an allowable number of stages of the path transistor logic circuit, wherein the order of the input signals of each of the sub-circuits is determined based on the stage number constraint.

In still another embodiment of the invention, the method further includes the step of: calculating, based on a delay time constraint defining allowable delay time between input/output signals of the given circuit and on an average delay time of the path transistor logic circuit, a stage number constraint defining an allowable number of stages of the path transistor logic circuit, wherein the order of the input signals of each of the sub-circuits is determined based on the stage number constraint and the signal transition probability.

In accordance with the above configuration, the method of the present invention includes a process of generating a BDD corresponding to a given logic specification. In the process, input signals are subjected to Shannon expansion, with higher priority given to signals having higher signal transition frequency (i.e., so as to be processed earlier) and lower priority given to signals having lower signal transition frequency (i.e., so as to be processed later).

Since input signals which were subjected to Shannon expansion earlier result in nodes closer to the output in the generated BDD, the present invention ensures that fewer logic stages are present between the output and inputs having higher signal transition frequency (after converting the nodes in the BDD into path transistors).

Since the internal signals included in a path between the output and an input signal having high signal transition frequency are also likely to have high signal transition frequency, the total signal transition frequency of all the signals in the circuit can be effectively reduced by reducing the number of logic stages in such paths.

Since a BDD is likely to gradually expand or branch out from the root to the branches as in the case of other diagrams or graphs, the number of path transistors connected to inputs having high signal transition probability is reduced according to the principle of the present invention. This also contributes to a decrease in the total signal transition frequency. As a result, the power consumption of the final circuit can be reduced.

Moreover, according to the present invention, a stage number constraint defining an allowable number of stages of path transistors included in the path transistor logic circuit is calculated in accordance with delay time constraints defining allowable delay time between input/output signals and a previously-obtained average delay time in the path transistor circuit.

In the design method of the present invention, where the nodes of a BDD are replaced by path transistors, the order of input signals in a Shannon expansion (through which the BDD is generated) directly affects the number of stages of path transistors between an input and the output. Therefore, the above-mentioned constraints regarding the number of stages of path transistors can be replaced by constraints regarding the order of input signals provided to Shannon expansion.

After obtaining the corresponding constraints regarding the number of stages of path transistors for all delay time constraints, the order of input signals to be provided to Shannon expansion is determined in such a manner that the constraints regarding the number of stages of path transistors is satisfied. A BDD is generated by providing the input signals to Shannon expansion in the thus-determined order. By converting the BDD into a path transistor circuit, a circuit is obtained which satisfies all the constraints regarding the number of stages of path transistors. By carefully designing the circuit in the technology-dependent processes to follow, a final circuit can be designed which also satisfies the given delay time constraints.

Moreover, according to the present invention, it is possible to previously divide a circuit into a plurality of sub-circuits at a stage of converting a logic specification into a usual logic circuit, thereby forestalling the difficulty in the optimization of input signal order to minimize the size of the resultant BDD. In such cases, the circuit is to be divided into sub-circuits in such a manner that each sub-circuit has a number of inputs equal to or smaller than a predetermined value.

In a design method where the circuit is previously divided into a plurality of sub-circuits, the entire circuit does not constitute one BDD. Since it is impossible to eliminate logical redundancy among a plurality of BDDs, the usual logic circuit obtained from the logic specification is preferably subjected to a logic optimization process before being divided into sub-circuits.

In such sub-circuits having limited numbers of inputs as mentioned above, it is possible to optimize the order of input variables provided to Shannon expansion. Therefore, the size of the BDD corresponding to each sub-circuit can be minimized.

On the other hand, in the case where the entire circuit is converted into one BDD, it is often impossible to minimize the BDD size owing to the difficulty in discovering the optimum order of input variables. Therefore, the scale of the final path transistor circuit can be effectively reduced by dividing the entire circuit into a plurality of sub-circuits.

Some circuits are of such a nature that the circuit scale can be made smaller by first converting the circuit into a network of a plurality of BDDs and then converting the network into a path transistor logic circuit, rather than converting the entire circuit into one integral BDD and generating a path transistor logic circuit therefrom.

Thus, the invention described herein makes possible the advantage of providing a method for designing path transistor logic by generating a BDD from a logic specification, the resultant circuit having a low power consumption, high speed, and a reduced scale.

This and other advantages of the present invention will become apparent to those skilled in the art upon reading and understanding the following detailed description with reference to the accompanying figures.

BRIEF DESCRIPTION OF THE DRAWINGS

FIG. 1 is a flowchart describing a flow of the process of a path transistor design method according to Example 1 of the present invention.

FIG. 3 is a flowchart describing a flow of the process of a path transistor design method according to Example 3 of the present invention.

FIG. 4 shows an example of functional descriptions for illustrating the path transistor design method according the present invention.

FIG. 5 shows an example of logic equations for illustrating the path transistor design method according the present invention.

FIG. 7 shows an example of test vectors used for the evaluation of signal transition probability according to Example 1 of the present invention.

FIG. 8 shows a result of input signals ordered in accordance with signal transition probability values according to Example 1 of the present invention.

FIG. 15 shows a result of input signals ordered while considering constraints regarding the number of stages of path transistors according to Example 2 of the present invention.

FIG. 18 shows a result of input signals ordered in such a manner that the BDD size for each sub-circuit is minimized according to Example 3 of the present invention.

FIG. 24 shows examples of delay constraints according to Example 4 of the present invention.

FIG. 25 shows a result of input signals ordered while considering constraints regarding the number of stages of path transistors and considering the signal transition probability values according to Example 4 of the present invention.

FIG. 26 shows a result of input signals ordered while considering constraints regarding the number of stages of path transistors for each sub-circuit according to Example 6 of the present invention.

DESCRIPTION OF THE PREFERRED EMBODIMENTS

Hereinafter, the present invention will be described by way of examples with reference to the accompanying figures.

EXAMPLE 1

FIG. 1 is a flowchart describing a flow of a process according to Example 1 of the present invention.

In FIG. 1, a logic specification 1 represents a specific logic process that is desired to be implemented as a circuit. The logic specification 1 is expressed in formats such as a hardware description language and logic equations.

Figures 4, 5, 7, 8:
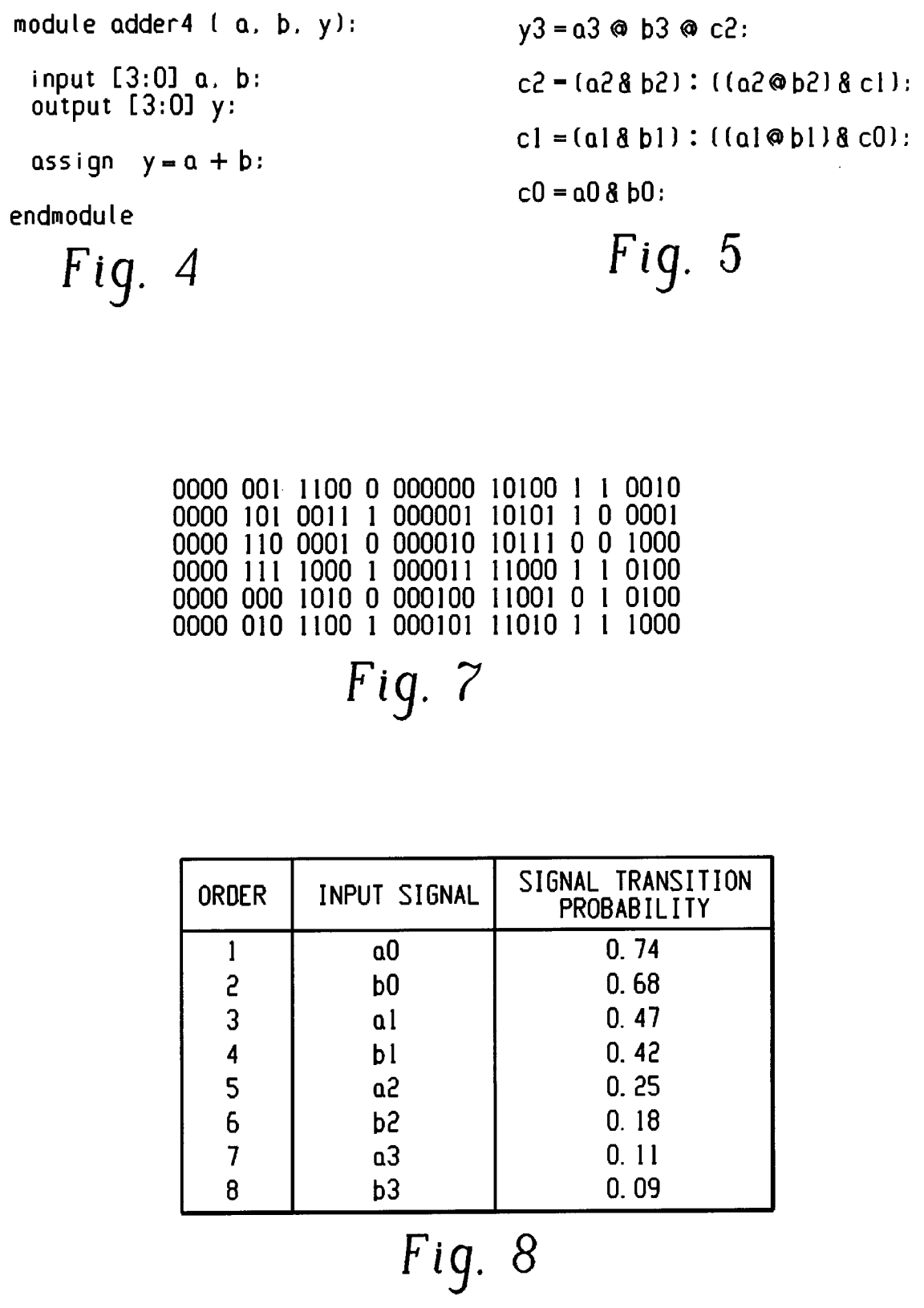

FIG. 4 shows an example of functional descriptions using a hardware description language (HDL) called verilog HDL.

The functional descriptions describe an operation of a 4-bit adder which adds two 4-bit inputs, namely a and b, and outputs the result of addition to y. The present example illustrates a combinational circuit, which can be directly processed by the design method of the invention using a BDD. Any sequential circuit can be divided into a combinational circuit and flip-flops. Accordingly, the design method of the present invention is applicable to the combinational circuit portion in the sequential circuit.

FIG. 5 is an example of logic equations representing the most significant bit y3 of the output y of the above-mentioned 4-bit adder. In FIG. 5, "&", "|", and "@" represent operands expressing logic AND, logic OR, and Exclusive logic OR, respectively. A logic specification can, for example, be expressed in terms of functional descriptions and/or logic equations. Alternatively, a logic specification may be expressed in another possible from.

At step 2, a logic circuit including the usual gates is generated based on the logic specification 1 expressed in terms of functional descriptions (in a HDL) and/or logic equations. Step 2 can be performed by either manually designing a logic circuit or using a logic synthesis tool. The present example adopts a logic synthesis tool for generating a logic circuit at step 2.

Figure 6:
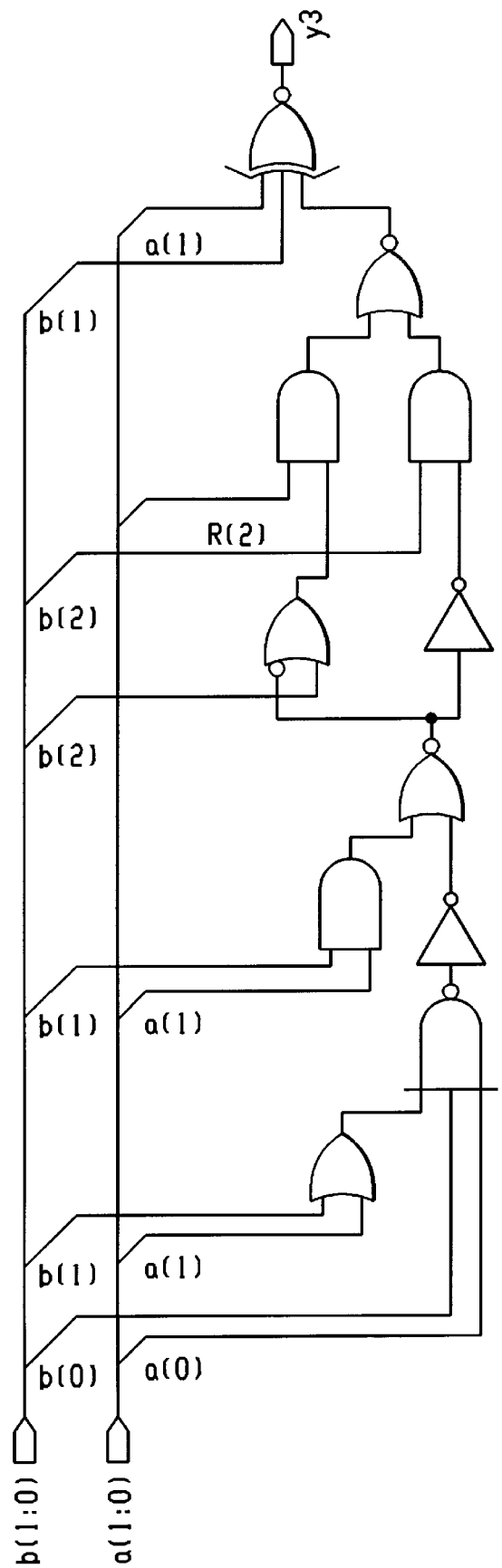
FIG. 6 is a logic circuit diagram generated from logic equations according to Example 1 of the present invention.

FIG. 6 shows an example of a logic circuit generated from the logic equations shown in FIG. 5 by the process of step 2. The logic circuit in FIG. 6 is expressed by a network of logic gates such as AND gates and OR gates. Although the present example illustrates a single-output logic circuit such as the logic circuit in FIG. 6, the present invention is also applicable to a multi-output logic circuit in principle.

At step 3, "signal transition probability" values of the respective inputs of the logic circuit generated at step 2 are evaluated, the "signal transition probability" being defined as follows: In general, a logic circuit is designed to be a synchronous circuit which operates in synchronization with clock signals. In such cases, the values of all the signals within the circuit are determined in synchronization with a clock signal, and each signal's value may vary at a given clock cycle or retain the value from a previous clock cycle without varying. The "signal transition probability" is defined as a value obtained by dividing {the number of clock cycles during which the value of a given signal varies} by {the total clock cycle number}.

A Signal in a given logic circuit consumes an amount of power expressed in eq.1 below. It can be seen that the power consumption of each signal is in proportion with the signal transition probability, based on the relationship of eq.2.

$$P=(1/2) \cdot C \cdot Vdd^2 \cdot SWR \qquad \text{eq.1}$$

(where C represents the load capacitance of a signal;
Vdd represents the supply voltage of a circuit; and
SWR represents the transition times of the signal per unit time)

$$SWR=STR/Tcycle \qquad \text{eq.2}$$

(where STR represents a signal transition probability; and Tcycle represents a clock cycle time)

Since the power consumption of a circuit as a whole equals the total power consumption of all the signals within the circuit, the power consumption of the entire circuit can be reduced by reducing the signal transition probability of each signal within the circuit.

In the case where the logic circuit constitutes one complete circuit, the inputs of the logic circuit are the external inputs of the complete circuit, and therefore the signal transition probability values of the logic circuit are determined in accordance with the specification of signals which are externally input to the circuit. However, it is commonplace to design a circuit in a hierarchial manner by dividing the entire circuit into a plurality of sub-circuits and logically designing each sub-circuit. In such cases, the signal transition probability values of the inputs to each sub-circuit are preliminarily determined in accordance with the specification of signals externally input to the circuit and with the logic of the peripheral sub-circuits that are coupled to the sub-circuit. Among a number of methods for evaluating signal transition probability suitably used for the present invention, the present example adopts a logic simulation method as described below.

FIG. 7 shows an example of test vectors to be supplied as input signals in a logic simulation. Each row in FIG. 7 defines one vector describing signals supplied to the inputs at a certain clock cycle. The number shown in each position of the vector represents the value of a corresponding input signal. The vectors sequentially describe input signals at consecutive clock cycles. That is, the first row represents the vector for the first clock cycle; the second row represents the vector for the second clock cycle, etc.

Once the input values at each cycle are determined, the input values are subjected to logic operations so as to determine the values of internal signals in the circuit at that clock cycle. By comparing a given signal value at each clock cycle with its value at one clock cycle before, it can be determined whether or not that signal has varied. Thus, the signal transition probability of that signal can be calculated. Since input signals of sub-circuits are also internal signals of the entire circuit, the signal transition probability values of inputs of the sub-circuits can also be obtained as above.

In order to accurately evaluate the signal transition probability values by the above-described logic simulation method, it is necessary to prepare appropriate test vectors which represent factual situations which are likely to be encountered during actual use.

At step 4, the inputs which have been evaluated at step 3 are arranged in the descending order of signal transition probability. FIG. 8 shows an exemplary list of input signals arranged in such an order.

At step 5, Shannon expansion is applied to the logic circuit generated at step 2 in accordance with the order of input signals determined at step 4, whereby a BDD is generated.

Herein, a Shannon expansion of a logic function f with an input variable p performs a conversion from the left side to the right side based on the relationship expressed by eq.3:

$$f=p\&f[p=1] | \hat{p}\&f[p=0] \qquad \text{eq.3}$$

(where "&" represents logic AND;
"|" represents logic OR; and
"^" represents logic inversion)

In eq.3 above, f[p=1] represents a logic function obtained by fixing the input p at 1 in the logic function f; and f[p=0] represents a logic function obtained by fixing the input p at 0 in the logic function f. As seen from eq.3, the logic equation on the left side is transformed into the logic equation on the right side. The logic equation on the right side represents an alternative selecting logic such that if p=1 than f=f[p=1] and that if p=0 then f=f[p=0].

The logic circuit generated at step 2 corresponds to a logic function expressed by eq.4. By subjecting y3 to a Shannon expansion with respect to a0 (according to the order determined at step 4), eq.5 and eq.6 are obtained, resulting in an expansion expressed by eq.7.

$$y3=((a0\&b0\&(a1|b1)|(a1\&b1))\&b2|(a0\&b0\& \\ (a1|b1)|(a1\&b1)|b2)|b2)\&a2)@a3@b3 \quad \text{eq.4}$$

$$y3[a0=1]=((b0\&(a1|b1)|(a1\&b1))\&b2|(b0\&(a2|b1)|(a1\& \\ b1)|b2)\&a2)@a3@b3 \quad \text{eq.5}$$

$$y3[a0=0]=((a1\&b1\&b2)|((a1\&b1)|b2)\&a2)@a3@b3 \quad \text{eq.6}$$

$$y3=a0\&y3[a0=1]|\hat{\ }a0\&y3[a0=0] \quad \text{eq.7}$$

By further subjecting y3 to a Shannon expansion with respect to b0, eq.8 is obtained. On the other hand, y3[a0=0] does not need to be subjected to a Shannon expansion since it does not encompass b0. Thus, an expansion expressed by eq.9 results.

$$y3[a0=1][b0=1] = \Big((a1\,|\,b1\,|\,(a1\&b1))\&b2\,\Big|\,(a1\,|\,b1\,|\,(a1\&b1))\,\Big| \quad \text{eq.8}$$
$$b2)\&a2\Big)\,@\,a3\,@\,b3$$

$$y3[a0=1][b0=0] = \Big((a1\&b1\&b2)\,\Big|\,((a1\&b1)\,|\,b2)\&a2\Big)\,@\,a3\,@b3$$

$$y3=a0\&b0\&y3[a0=1][b0=1]|a0\&\hat{\ }b0\&y3[a0=1] \\ [b0=0]|\hat{\ }a0\&y3[a0=0] \quad \text{eq.9}$$

Figure 9:
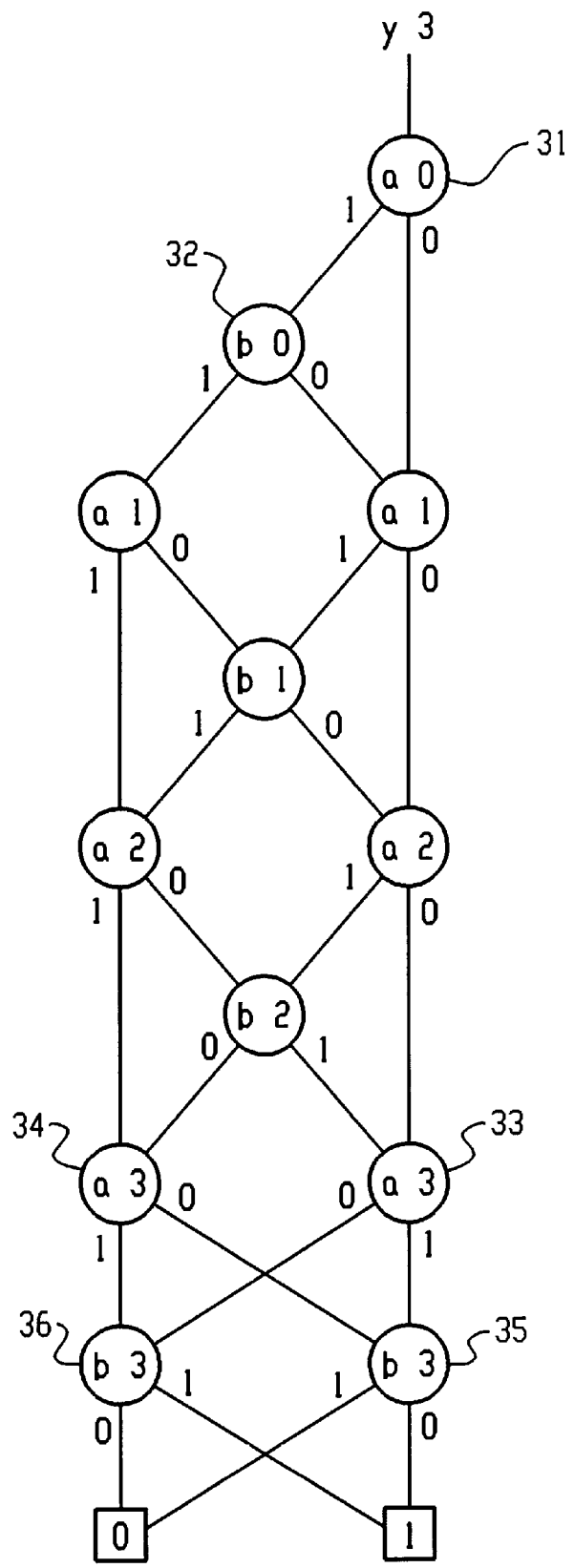
FIG. 9 is a diagram showing a BDD generated from a logic circuit according to Example 1 of the present invention.

Furthermore, y3 is subjected to a Shannon expansion with respect to a1, b1, a2, b2, a3, and b3. FIG. 9 shows a BDD thus generated. Each non-terminal node (i.e., a round node) in the BDD represents a logic function which has been subjected to a Shannon expansion with respect to an input variable shown in the node. Edges which extend upward from each node are output edges that transfer the logic function represented by the node to an upward node. Edges which extend downward from each node are either "1" edges (denoted by "1") or "0" edges (denoted by "0"). Each "1" edge is connected to a node (downward) that corresponds to a logic function subjected to a Shannon expansion with the input variable fixed at 1. Each "0" edge is connected to a node (downward) that corresponds to a logic function subjected to a Shannon expansion with the input variable fixed at 0.

Accordingly, the uppermost node 31 corresponds to the output y3 of the logic circuit. A node 32 corresponds to a logic function equivalent to the logic function y3 with the input variable a0 fixed at 1. Terminal nodes (i.e., square nodes) seen at the bottom of FIG. 9 are denoted as 0 and 1, corresponding to logic constants of 0 and 1, respectively. Since the "0" edge of a node 35 is connected to the logic constant "1", and the "1" edge of a node 35 is connected to the logic constant "0", it will be understood that the node 35 corresponds to a logic function expressed by eq.10. Similarly, a node 36 corresponds to a logic function b3. A node 33 corresponds to a logic function expressed by eq.11.

$$b3\&0|\hat{\ }b3\&1=\hat{\ }b3 \quad \text{eq.10}$$

$$a3\&\hat{\ }b3|\hat{\ }a3\&b3=a3@b3 \quad \text{eq.11}$$

Figure 10:
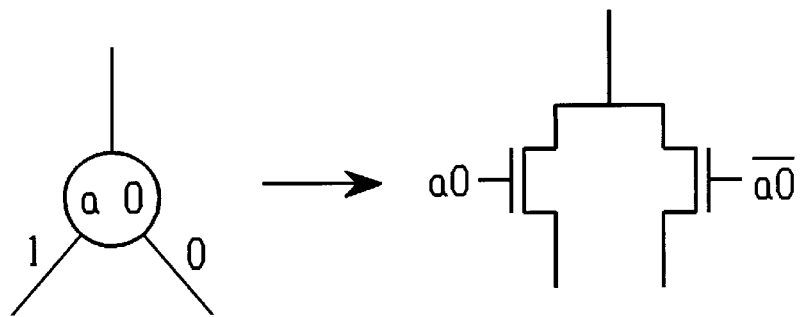
FIG. 10 is a diagram showing the conversion of a BDD into a path transistor logic circuit according to Example 1 of the present invention.

At step 6, the BDD generated at step 5 is converted into a path transistor logic circuit. As mentioned above, each node in the BDD is an alternative logic, whereas a path transistor logic is based on two-input selectors. Therefore, by performing the conversion shown in FIG. 10 for each node of the BDD, a corresponding path transistor circuit can be obtained.

Figure 11:
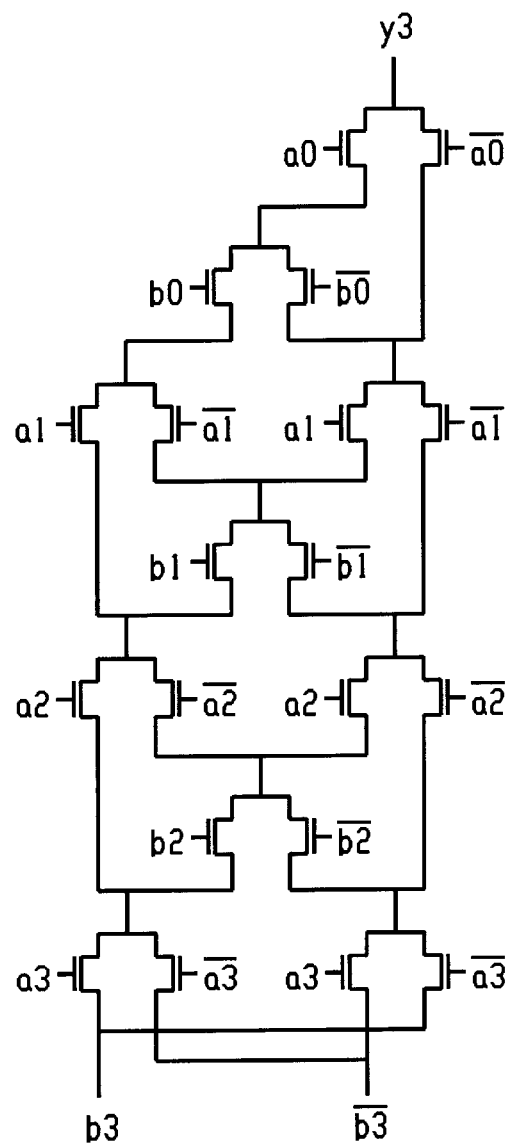
FIG. 11 is a diagram showing a path transistor logic circuit converted from a BDD according to Example 1 of the present invention.

FIG. 11 shows a path transistor logic circuit converted from the BDD shown in FIG. 9. It can be seen from FIG. 11 that inputs having high signal transition probability, e.g., a0 and b0, have fewer stages of path transistors between the input and the output y3, and that inputs having low signal transition probability, e.g., a3 and b3, have larger stages of path transistors between the input and the output y3, indicative of a reduced power consumption of the circuit.

In practice, it is impossible to connect such a large number of path transistors in series as shown in FIG. 11 because buffers must be inserted in appropriate portions for restoring potential levels and amplifying currents. However, the insertion of buffers pertains to the subsequent technology-dependent logic design steps, rather than the technology-independent logic design steps, which is the subject matter of the present invention. Therefore, the number of stages of path transistors between the input and the output of a final path transistor logic circuit, and the transition probability per unit time of internal signals cannot be accurately estimated at this stage. However, the relative distances from the respective inputs to the output obtained at this stage are also maintained in the final circuit.

Figure 12:
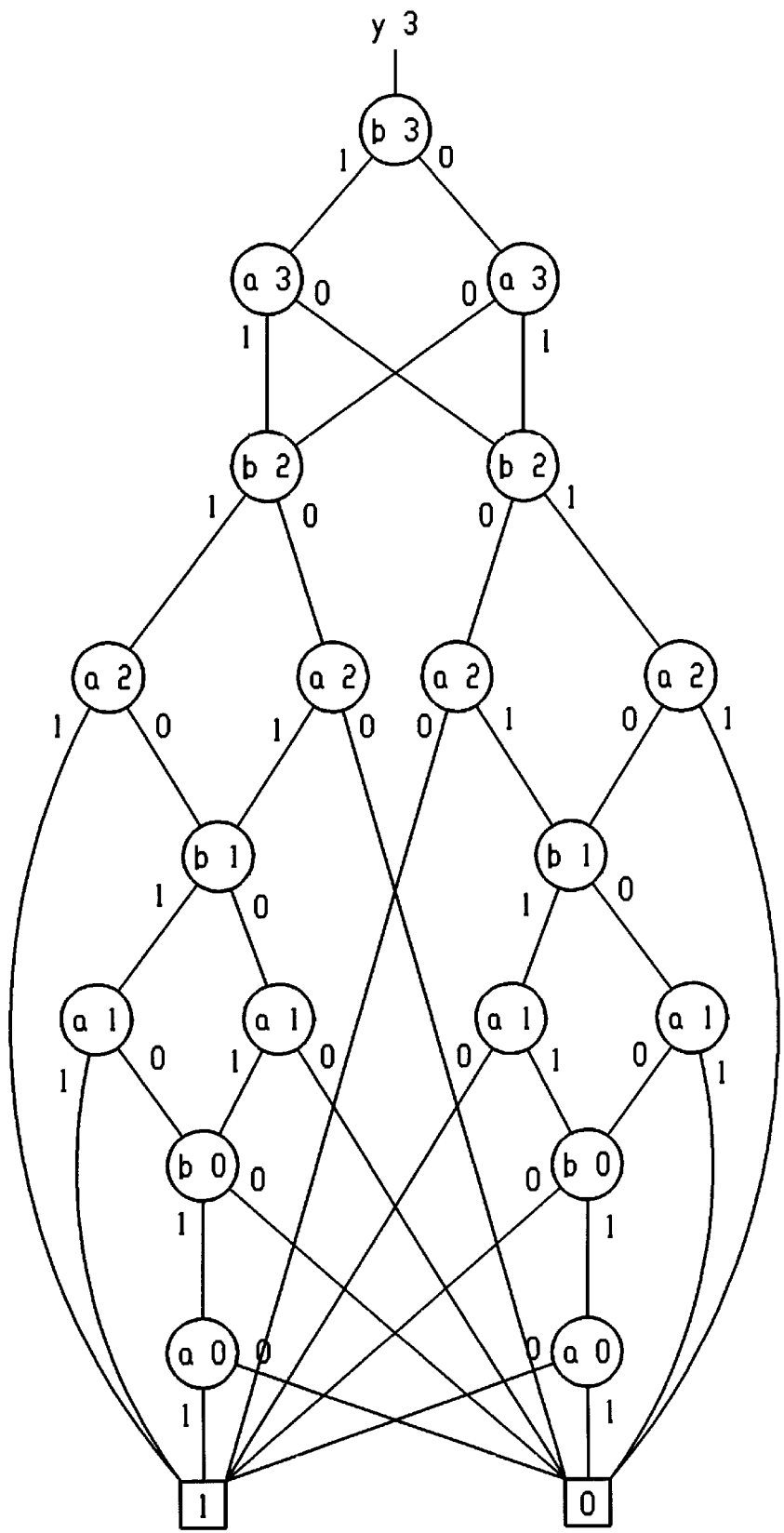
FIG. 12 is a diagram showing a BDD generated from a logic circuit according to an input order determined by a conventional method.

FIG. 12 shows a conventional BDD converted from a logic circuit generated at step 2 by a method in which, without sequencing the input signals in an order based on the signal transition probability as in the present example, Shannon expansion is performed while giving higher priority (i.e., earlier) for inputs having stronger control over the output and for inputs having higher local calculability as described in "Logic Verification using Binary Diagrams in a Logic Synthesis Environment" (IEEE Proc. ICCAD '88 p.6, 1988) (It is reported that giving such priority to inputs results in the generation of a BDD of a relatively small scale).

Figures 13, 14:
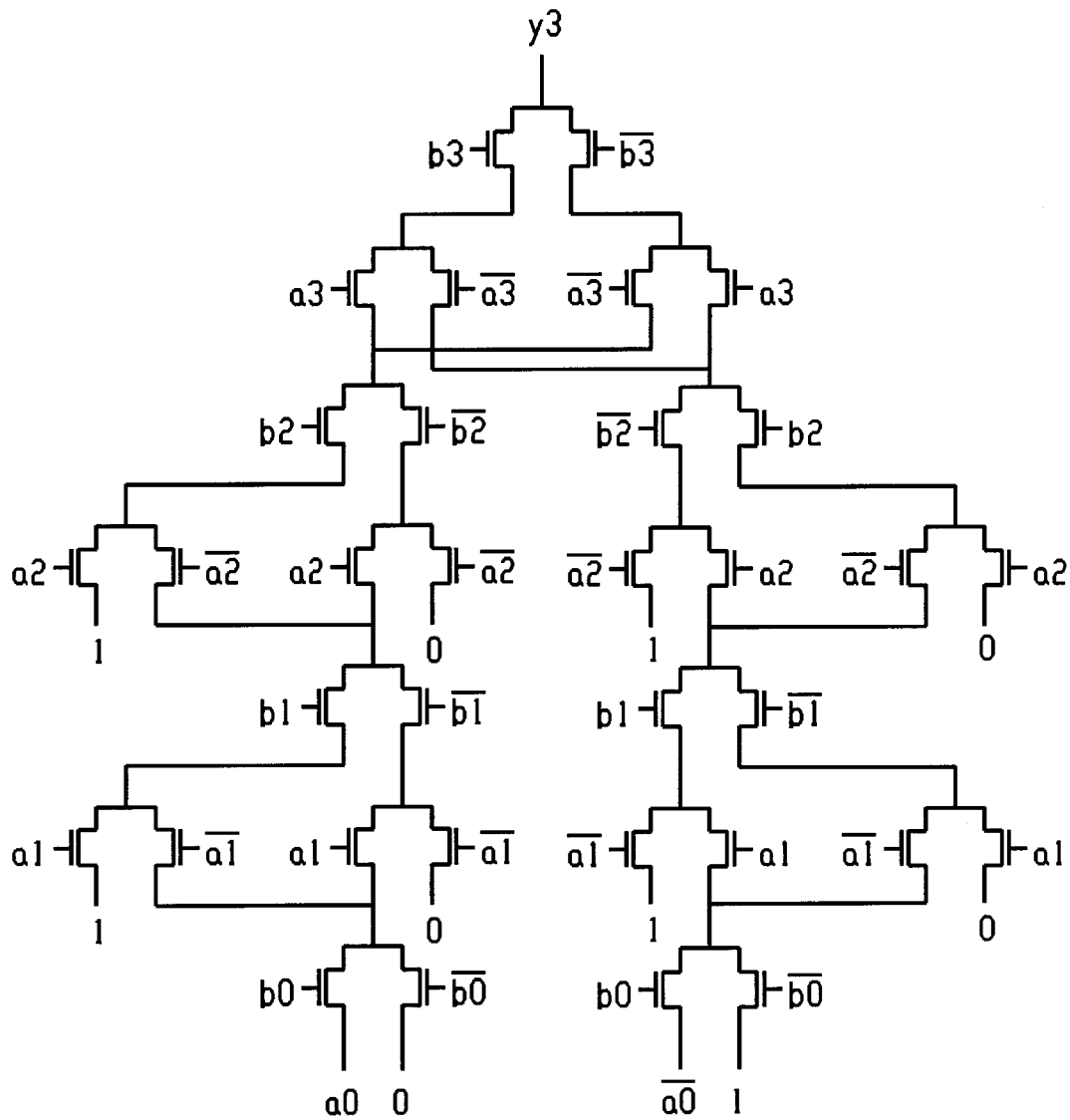
FIG. 13 is a diagram showing a path transistor logic circuit converted from a BDD generated by a conventional method.
FIG. 14 shows examples of delay constraints according to Example 2 of the present invention.

FIG. 13 shows a conventional path transistor logic circuit converted from the BDD shown in FIG. 12. As seen from FIG. 13, the path transistor logic circuit of FIG. 13 includes more stages of path transistors between inputs having higher signal transition probability (e.g., a0 and b0) and the output y3 than in the path transistor logic circuit of the present example (FIG. 11). As mentioned earlier, internal signals included in a path between the output and an input with high transition probability are also likely to have high transition frequency. Therefore, the path transistor logic circuit shown in FIG. 13 has a larger power consumption than that of the path transistor logic circuit of the present example (FIG. 11).

By using a method described in "Technology Decomposition and Mapping Targeting Low Power Dissipation" (30th IEEE Design Automation Conference p.68), the inventors estimated the sum of signal transition probability of all the signals included in each of the circuits of FIGS. 11 and 13. As a result, it was discovered that the present example (FIG. 11) had a total signal transition probability of 11.4, whereas the conventional example (FIG. 13) had a total signal transition probability of 16.6, indicative of a 30%-reduction (approximately) in the signal transition probability of the circuit of the present example. Thus, the method of the present example was shown to provide a large effect in the reduction of power consumption.

EXAMPLE 2

Figure 2:
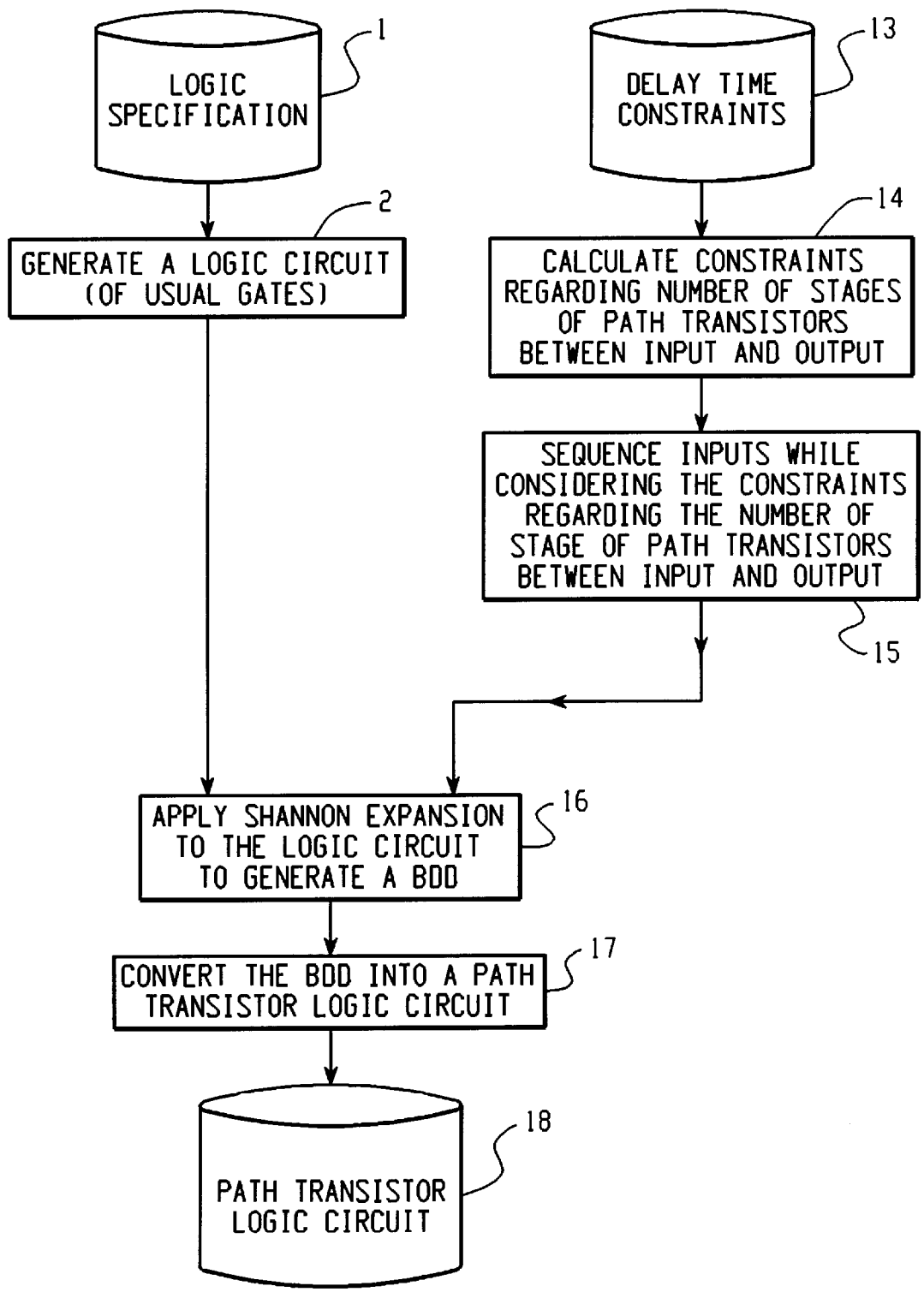
FIG. 2 is a flowchart describing a flow of the process of a path transistor design method according to Example 2 of the present invention.

FIG. 2 is a flowchart describing a flow of a process according to Example 2 of the present invention. Since step 2 for generating a logic circuit (including the usual gates) is identical with step 2 in Example 1, the description thereof is omitted in Example 2.

In designing a logic circuit, it is necessary to satisfy a given logic specification 1. It is often required that the logic circuit must satisfy delay time constraints 13 as well as the logic specification 1. In the case of a combinational circuit (as in the present example), such delay time constraints are often provided in the form of maximum delay values allowed between the respective inputs to the output, as shown in FIG. 14.

The exemplary delay time constraints in FIG. 14 describe that the delay time from the input a0 to the output y3 must be equal to or smaller than 2.0 ns, and that the delay time from the input b0 to the output y3 must be equal to or smaller than 1.5 ns. No delay time constraints are provided for inputs other than a0 and b0. Delay time constraints are sometimes provided in the form of maximum delay values allowed between all inputs to all outputs, but are often provided, in actual designing, in the form of maximum delay values for particular inputs (as in the present example) because some inputs are delayed more than other input signals, etc.

At step 14, constraints regarding the number of stages of path transistors between inputs and the output are calculated based on the delay time constraints provided as above. Prior to the calculation, an average delay time for each stage of path transistors must be obtained somehow. Since such values tend to vary depending on the nature of the circuit being designed, it is important to obtain reliable values based on statistics of as many circuits as possible.

Herein it is assumed that each stage of path transistors is known to have an average delay time of 0.4 ns. Thus, according to the delay time constraints shown in FIG. 14, the following constraints regarding the number of stages of path transistors can be obtained: the number of stages of path transistors from the input a0 to the output y3 must be equal to or smaller than 5; and the number of stages of path transistors from the input b0 to the output y3 must be equal to or smaller than 3.

At step 15, the order of input variables is determined in view of the constraints regarding the number of stages for the respective inputs as obtained at step 14. Since the path transistor design method according to the present invention is such that the structure of the BDD is reflected on the structure of the final circuit, it is possible to adjust the number of stages between various inputs and the output of the generated circuit by controlling the order of input variables provided to Shannon expansion.

Since no delay time constraints are provided for inputs other than a0 and b0 in the present example, the order of input variables for Shannon expansion is determined so as to satisfy the constraints regarding the number of stages with respect to a0 and b0 by using, for example, the method described in "Logic Verification using Binary Diagrams in a Logic Synthesis Environment" (supra)

FIG. 15 shows the order of input variables as determined at step 15. In the logic equations shown in FIG. 5, a3 and b3, a2 and b2, a1 and b1, and a0 and b0 are paired up, indicative of their local calculability. Therefore, the input variables of each pair are given sequential numbers in FIG. 15. Moreover, since the input variables a3, b3, a2, b2, a1, b1, a0, and b0 have stronger control over the output in this order, this order is primarily preserved in FIG. 15 except for a0 and b0 (which have constraints regarding the number of stages). As a result, b0 is moved to the third position, and a0 is moved to the fourth position.

Figure 16:
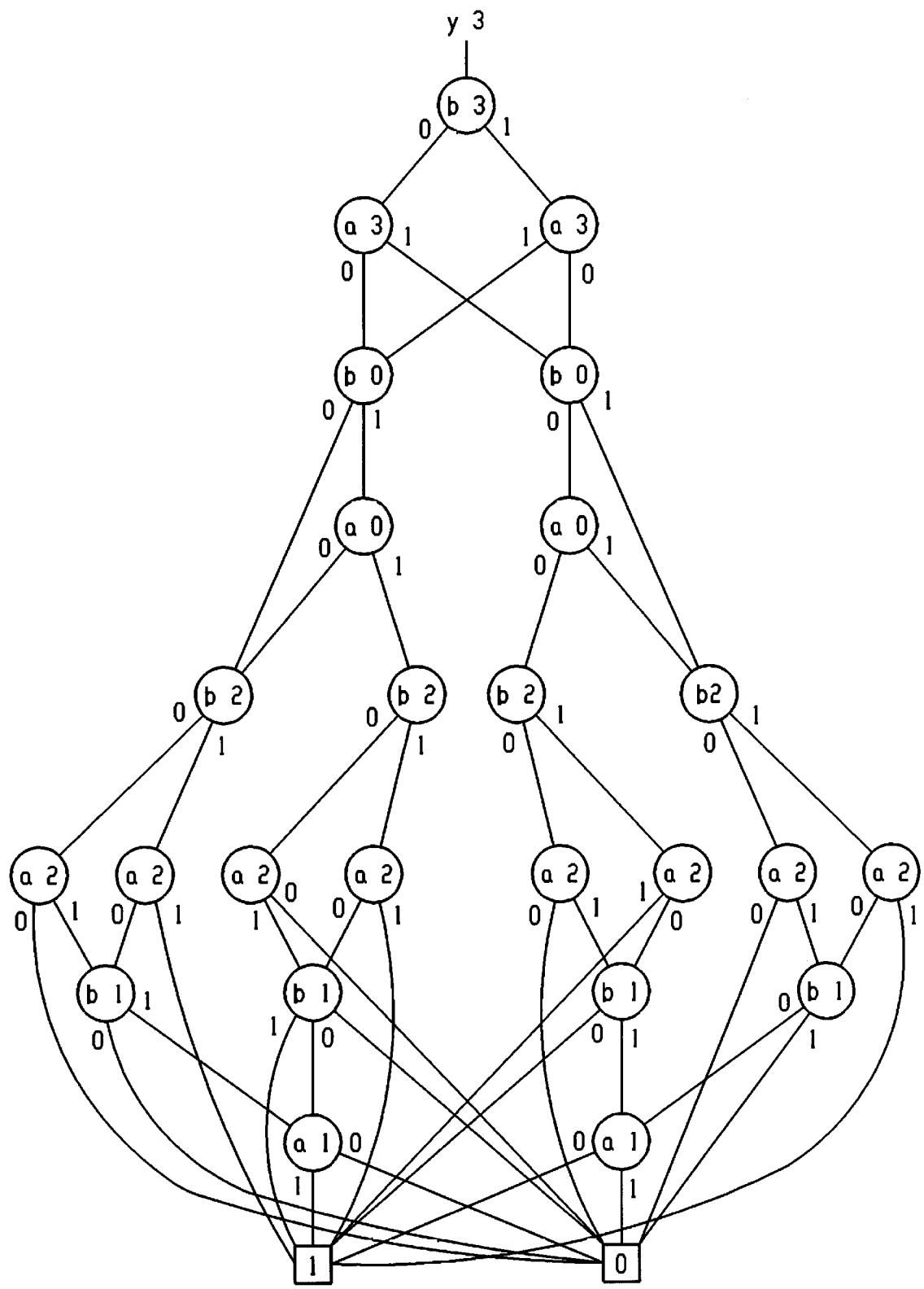
FIG. 16 is a diagram showing a BDD generated from a logic circuit according to Example 2 of the present invention.

At step 16, Shannon expansion is applied to the logic circuit to generate a BDD in accordance with the order of input variables determined at step 15, as in step 5 of Example 1. FIG. 16 shows a BDD thus generated.

Figure 17:
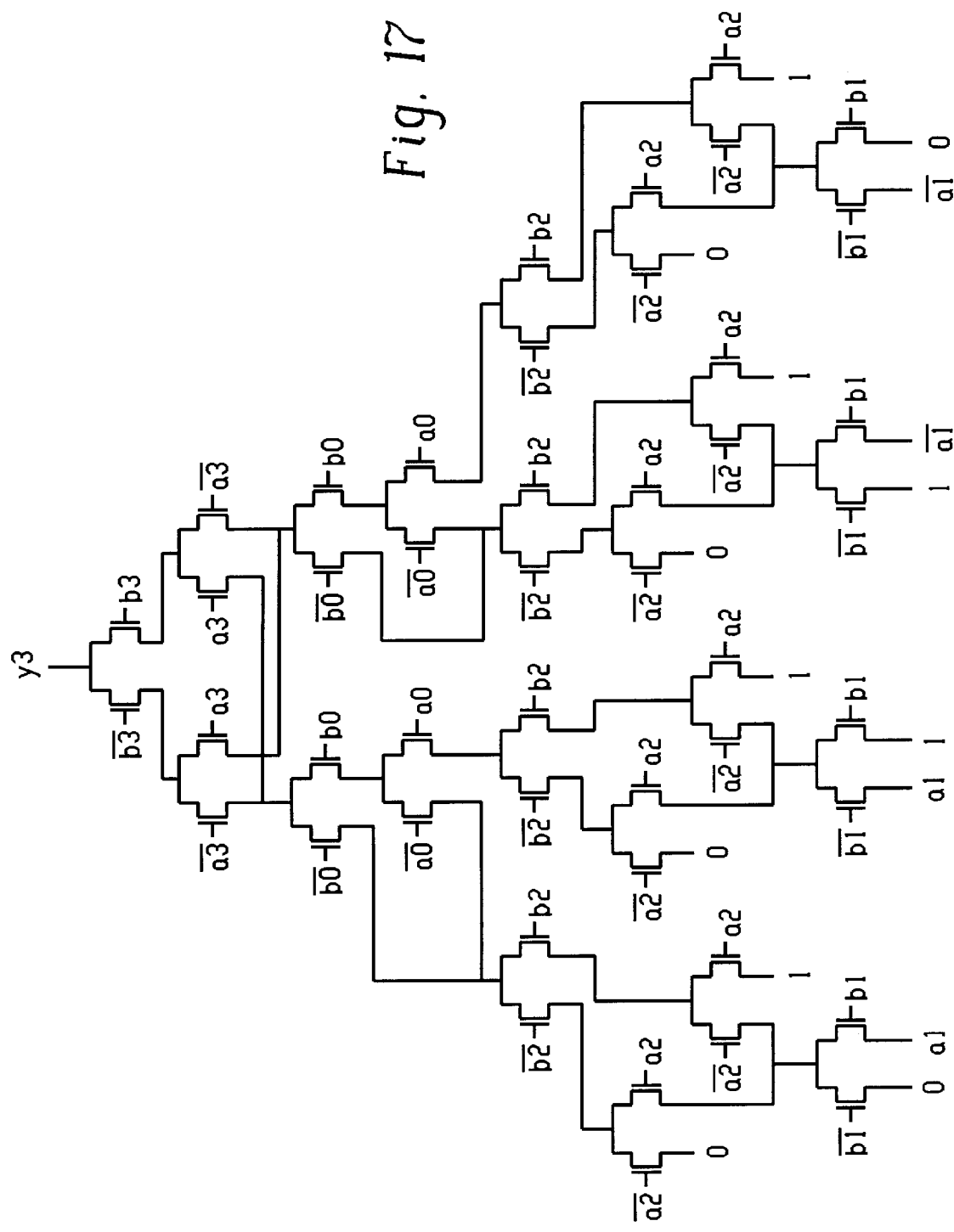
FIG. 17 is a diagram showing a path transistor logic circuit converted from a BDD according to Example 2 of the present invention.

At step 17, the BDD generated at step 16 is converted into a path transistor logic circuit, as in step 6 of Example 1. FIG. 17 shows a path transistor logic circuit thus generated.

As shown in FIG. 17, the resultant circuit includes four stages of path transistors between the input a0 to the output y3, and three stages of path transistors between the input b0 to the output y3. Although an accurate evaluation of the delay time of a given circuit is impossible until the layout design following the technology-dependent logic design steps (which in turn follow the technology-independent logic design steps to which the present invention is directed), it is possible to satisfy delay time constraints by providing sufficient design margins in calculating the number of logic stages of path transistors based on the delay time constraints at step 14.

On the other hand, the circuit in FIG. 13 (which was generated by determining the order of input variables provided to Shannon expansion without considering delay constraints) includes seven stages of path transistors between the inputs a0 and b0 to the output y3. Since each stage of path transistors is assumed to have an average delay time of 0.4 ns, the circuit shown in FIG. 13 fails to satisfy the delay time constraints, indicative of impracticality.

EXAMPLE 3

FIG. 3 is a flowchart describing a flow of a process according to Example 3 of the present invention. In nature, the method of the present example is most effective for circuits whose scale is too large to be optimally converted into a BDD. However, for conciseness, the following description will be directed to the logic specification shown in FIG. 5 (as in Examples 1 and 2).

Since step 2 for generating a logic circuit (including the usual gates) in identical with step 2 in Example 1, the description thereof is omitted in Example 3.

At step 23, a logic circuit generated at step 2 is subjected to a logic optimization process in order to eliminate logical redundancy included in the circuit.

The reason for conducting a logic optimization process in the present example is that the method of the present example divides the logic circuit into a plurality of sub-circuits to separately convert each sub-circuit into a path transistor circuit. If there is some logical redundancy among sub-circuits, the redundancy will be preserved in the final circuit, thereby increasing the scale thereof.

In conventional methods which convert the entire circuit into a BDD, the structure of the converted BDD does not depend on the structure of the original logic circuit (because the BDD is uniquely determined based on the particular logic and the input order during Shannon expansion), and therefore step 23 is not required.

FIG. 6 shows a logic circuit generated by performing steps 2 and 23 based on a logic specification 5 (although not particularly mentioned in Examples 1 and 2, the logic circuit in FIG. 6 is obtained through a logic optimization process at step 23).

At step 24, the generated logic circuit is divided into a plurality of sub-circuits. Herein, the circuit is divided with respect to an internal signal (corresponding to signal i in FIG. 6) having a fan-out of 2 or more. This method is often used in a technology mapping process for assigning cells to technology-independent logic, which is performed during a logic synthesis process.

Next, the number of inputs of each sub-circuit is examined. If the number of inputs exceeds a predetermined value, the sub-circuit is further divided into smaller sub-circuits, until the number of inputs of each sub-circuit satisfies a predetermined upper limit. Herein, the upper limit value of number of inputs is defined as a number of inputs which enables the optimization of input signal order in Shannon expansion.

The logic circuit in FIG. 6, which has only eight inputs, does not need to be divided. However, for the sake of explanation of the principle of the present example, the circuit is divided into two sub-circuits at signal i.

The sub-circuits as divided above have logic functions expressed by eq.12 and eq.13.

$$i = \tilde{}((a0\&b0\&(a1|b1))|(a1\&b1)) \qquad \text{eq. 12}$$

$$y3 = (((\tilde{}i|b2)\&a2)|(\tilde{}i\&b2))@a3@b3 \qquad \text{eq.13}$$

At step 25, the optimum input order for Shannon expansion is determined by using a method described in, for example, "Finding the optimal variable ordering for binary decision diagram" (IEEE Trans. Comput., C-39(5) p.710, May 1990). This method for determining the order of input variables is applicable to the present example because the number of inputs of each sub-circuit has been limited by the division of the circuit at step 24. Herein, it is assumed that the input order was determined as shown in FIG. 18.

At step 26, Shannon expansion is applied to each sub-circuit to generate a BDD in accordance with the order of input variables determined at step 25. The description of step 25 is omitted because it is identical with the process of step 5 in Example 1 repeated for each sub-circuit.

A logic expression composed of a network of a plurality of BDDs connected to one another (as generated at step 26) is no longer a BDD as a whole. However, although not applicable to general applications of BDDs, the above principle can be effectively used for the purpose of reducing the total number of BDD nodes in methods where a BDD is directly converted into a logic circuit as in the present invention.

Figure 19:
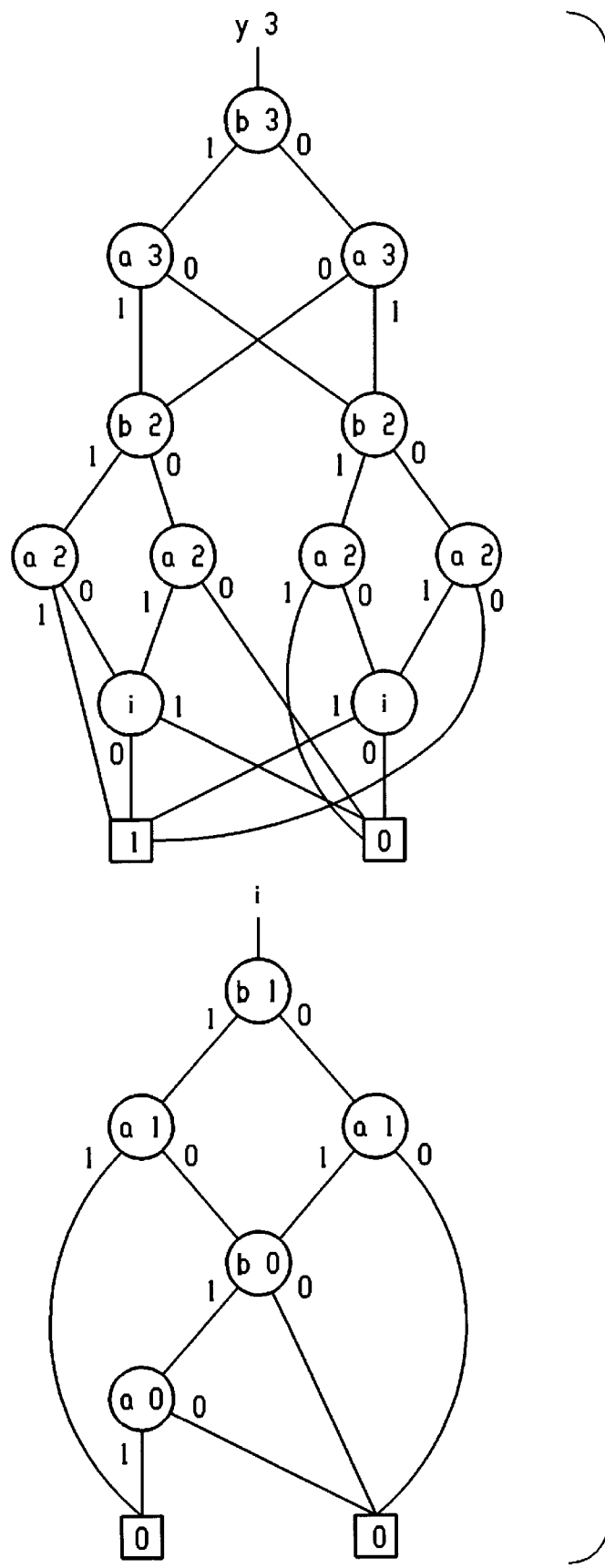
FIG. 19 is a diagram showing a BDD generated from a logic circuit according to Example 3 of the present invention.

FIG. 19 shows a BDD thus generated.

Figure 20:
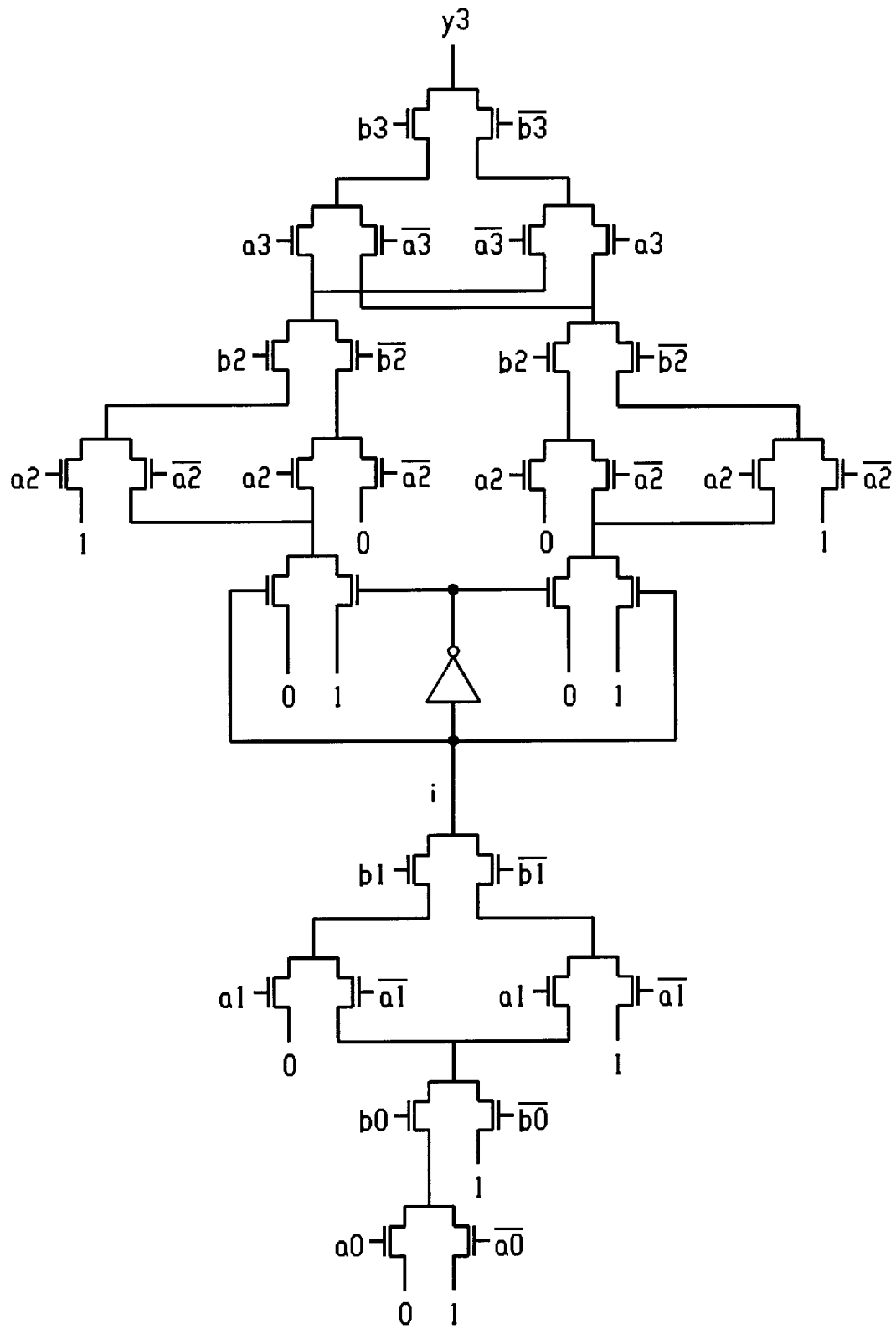
FIG. 20 is a diagram showing a path transistor logic circuit converted from a BDD according to Example 3 of the present invention.

At step 27, the BDD generated at step 26 is converted into a path transistor logic circuit, as in step 6 of Example 1. FIG. 20 shows a path transistor logic circuit thus generated.

EXAMPLE 4

Figure 21:
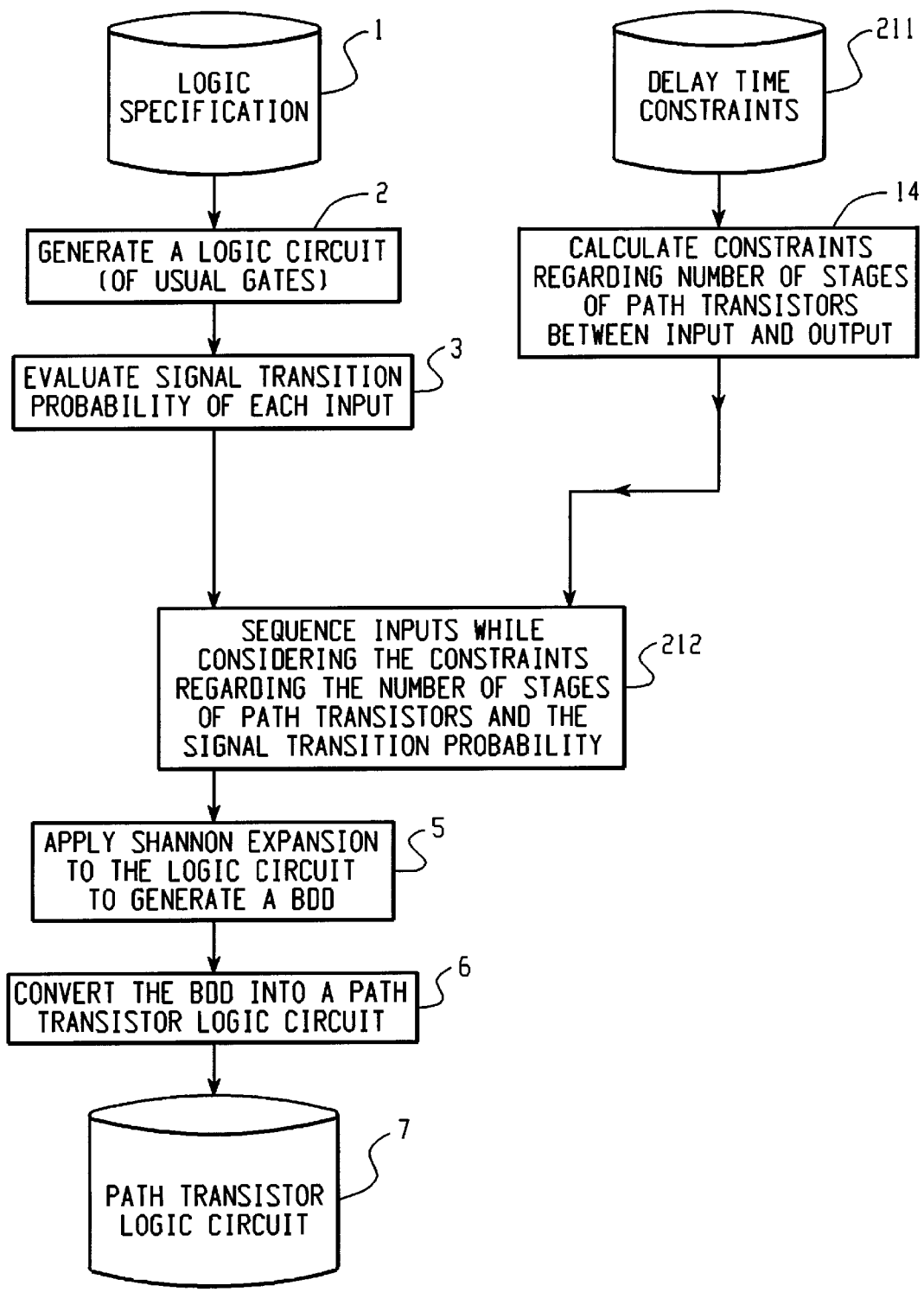
FIG. 21 is a flowchart describing a flow of the process of a path transistor design method according to Example 4 of the present invention.

FIG. 21 is a flowchart describing a flow of a process according to Example 4 of the present invention. A logic specification 1, step 2 for generating a logic circuit (including the usual gates), and step 3 for evaluating the signal transition probability of input signals are identical with the corresponding steps in Example 1, and the description thereof is omitted in Example 4. It is assumed that the signal transition probability values as shown in FIG. 8 have been obtained as in Example 1.

The exemplary delay time constraints 211 in FIG. 24 describe that the delay time from the input a3 to the output y3 must be equal to or smaller than 1.2 ns, and that the delay time from the input b3 to the output y3 must be equal to or smaller than 1.7 ns.

At step 14, constraints regarding the number of stages of path transistors between inputs and the output are calculated based on the delay time constraints provided as above. However, the detail thereof is omitted because it is similar to step 14 in Example 2. Assuming that each stage of path transistors has an average delay time of 0.4 ns, the following constraints regarding the number of stages of path transistors must be satisfied: the number of stages of path transistors from the input a3 to the output y3 must be equal to or smaller than 3; and the number of stages of path transistors from the input b3 to the output y3 must be equal to or smaller than 4.

At step 211, the order of input variables is determined based on the signal transition probability of various inputs as determined at step 3 and the constraints regarding the number of stages for the respective inputs as obtained at step 14.

Since the present example aims at reducing the power consumption under the condition that the generated circuit satisfies the delay time constraints, input signals are arranged in the descending order of signal transition probability so as to satisfy the constraints regarding the number of stages of path transistors for a3 and b3. Thus, the constraints regarding the number of stages of path transistors have a higher priority than the signal transition probability. FIG. 25 shows an exemplary list of input signals sequenced in such an order.

Step 5 of applying Shannon expansion to the logic circuit to generate a BDD and step 6 of converting the BDD into a path transistor logic circuit are identical with the corresponding steps in Example 1, and hence the description thereof is omitted.

Thus, in accordance with the design method of the present example, it is possible to generate a path transistor logic circuit which consumes relatively little power while satisfying given delay time constraints.

EXAMPLE 5

Figure 22:
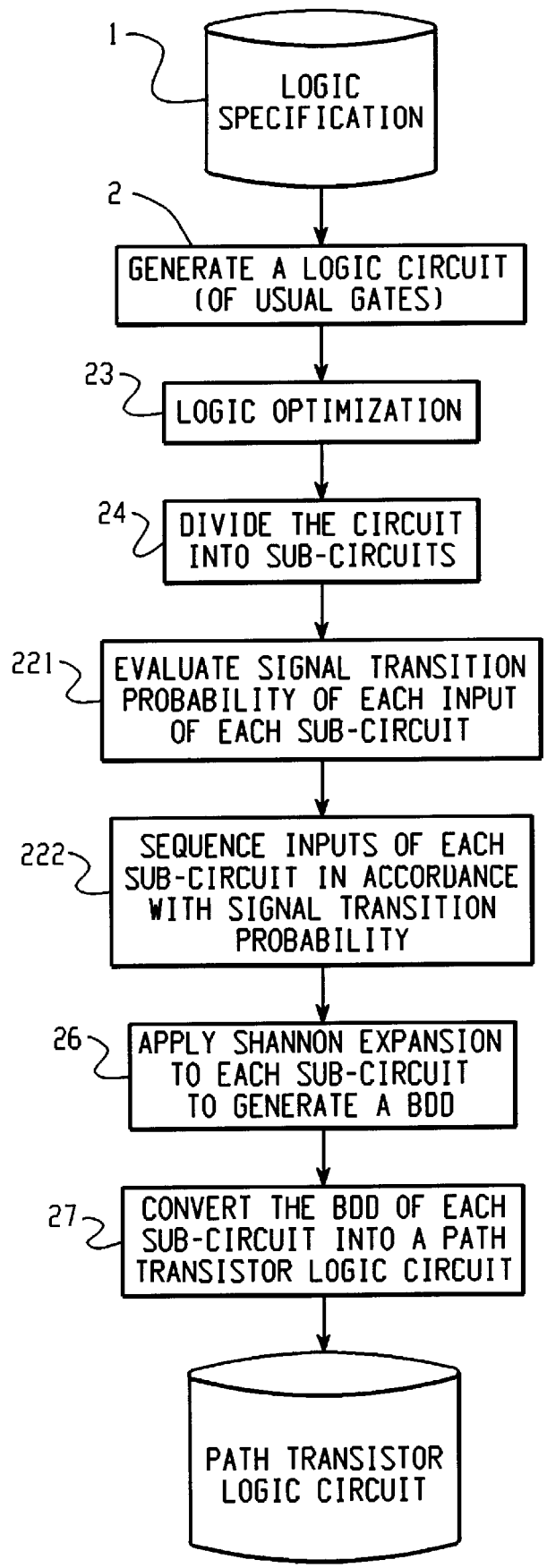
FIG. 22 is a flowchart describing a flow of the process of a path transistor design method according to Example 5 of the present invention.

FIG. 22 is a flowchart describing a flow of a process according to Example 5 of the present invention. A logic specification 1, step 2 for generating a logic circuit (including the usual gates), step 23 for logical optimization, and step 24 for dividing the circuit are identical with the corresponding steps in Example 3, and hence the description thereof is omitted in Example 5.

At step 221, the signal transition probability values of the input signals of each of the sub-circuits divided at step 24 are estimated, which can be performed by using a logical simulation as in step 3 of Example 1.

At step 222, input signals for each sub-circuit are arranged in the descending order of signal transition probability, which can be performed in a manner similar to step 4 of Example 1.

The present example determines the order of input variables based on signal transition probability in order to reduce the power consumption of the circuit. However, in practice, reduction in the power consumption and reduction in the circuit scale are often incompatible. In such cases, it is necessary to sequence input signals while considering the trade-off between both factors, as is intended by the present invention.

Step 26 of applying Shannon expansion to each sub-circuit to generate a BDD and step 27 of converting the BDD for each sub-circuit into a path transistor logic circuit are identical with the corresponding steps in Example 3, and hence the description thereof is omitted.

Thus, in accordance with the design method of the present example, It is possible to generate a large-scale path transistor logic circuit which consumes relatively little power.

EXAMPLE 6

Figure 23:
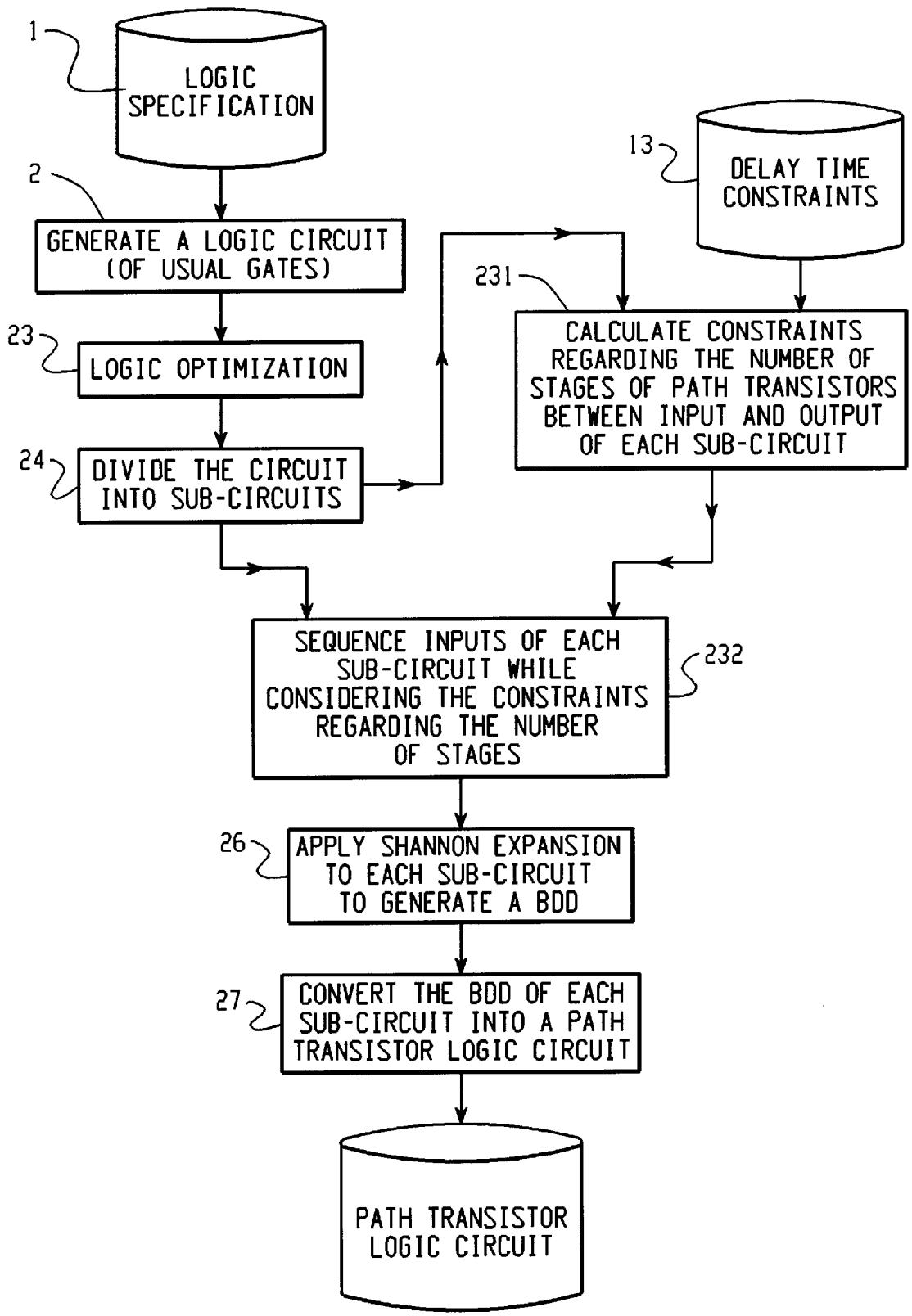
FIG. 23 is a flowchart describing a flow of the process of a path transistor design method according to Example 6 of the present invention.

FIG. 23 is a flowchart describing a flow of a process according to Example 6 of the present invention. A logic specification 1, step 2 for generating a logic circuit (including the usual gates), step 23 for logical optimization, and step 24 for dividing the circuit are identical with the corresponding steps in Example 3, and hence the description thereof is omitted in Example 6.

It is assumed that the same delay time constraints 13 shown in FIG. 14 are given.

At step 231, constraints regarding the number of stages of path transistors between inputs and the output of each of the sub-circuits divided at step 24 are calculated based on the delay time constraints 13. In the present example, the constraints regarding the number of stages of path transistors between inputs and the output of the entire circuit are first calculated by a method similar to that used in step 14 of Example 2, and then the resultant constraints are appropriately allocated among the sub-circuits.

As shown in FIG. 15, the constraints regarding the number of stages for the entire circuit are as follows: the number of stages of path transistors from the input a0 to the output y3 must be equal to or smaller than 5 in the entire circuit; and the number of stages of path transistors from the input b0 to the output y3 must be equal to or smaller than 3 in the entire circuit. By allocating these constraints among sub-circuits so as to satisfy the delay time constraints, the following constraints regarding the number of stages result: the number of stages of path transistors from the input a0 to signal i of the sub-circuit corresponding to eq.12 must be equal to or smaller than 3; the number of stages of path transistors from the input b0 to signal i of the sub-circuit corresponding to eq.12 must be equal to or smaller than 1; and the number of stages of path transistors from signal i to the output y3 of the sub-circuit corresponding to eq.13 must be equal to or smaller than 2.

The calculation of the constraints regarding the number of stages between the input and the output of each sub-circuit based on delay time constraints can be performed by various other methods, which are also encompassed by the present invention.

At step 232, the input signals are sequenced for each sub-circuit while considering the above-mentioned constraints regarding the number of stages by a method similar to that in step 15 of Example 2. FIG. 26 shows an exemplary list of input signals sequenced in such an order.

Step 26 of applying Shannon expansion to each sub-circuit to generate a BDD and step 27 of converting the BDD for each sub-circuit into a path transistor logic circuit are identical with the corresponding steps in Example 3, and hence the description thereof is omitted.

Further, by combining the method of Example 5 (FIG. 22) with the method of Example 6 (FIG. 23), the order of the input signals of each of the sub-circuits may be determined based on the stage number constraint and the signal transition probability.

As described above, the present invention makes it possible to generate a path transistor circuit from a given logic specification, the resultant path transistor circuit having the following advantages:

(1) Since the path transistor circuit of the present invention includes fewer stages of path transistors between the output and inputs having higher signal transition probability, signals having high signal transition probability are not conveyed over long distances. As a result, the total signal transition probability of the entire circuit decreases, thereby reducing the power consumption of the circuit.

(2) The number of stages of path transistors between the output and an input having delay time constraints is limited based on the delay time constraints. By providing delay time constraints between the Input and output defining a critical path, it becomes possible to increase the operation speed of the circuit.

(3) The method of the present invention realizes practical circuit sizes even for circuits having a large number of inputs (which cannot be optimized by conventional design methods and therefore tend to become larger than they should be).

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for designing a path transistor logic circuit based on a logic specification of a given circuit, the method comprising the steps of:

generating a logic circuit including logic gates based on the logic specification, the logic circuit receiving input signals;

evaluating signal transition probability of each of the input signals of the logic circuit;

arranging the input signals of the logic circuit in a descending order of signal transition probability;

generating a binary decision diagram corresponding to the logic circuit by applying Shannon expansion to the logic circuit in accordance with the descending order of signal transition probability, the binary decision diagram including nodes; and replacing each of the nodes of the binary decision diagram with a two-input selector circuit including a path transistor so as to obtain the path transistor logic circuit.

2. A method according to claim 1, further comprising the step of:

calculating, based on a delay time constraint defining allowable delay time between input/output signals of the given circuit and on an average delay time of the path transistor logic circuit, a stage number constraint defining an allowable number of stages of the path transistor logic circuit, wherein the input signals of the logic circuit are arranged in view of the stage number constraint and the signal transition probability.

3. A method according to claim 2, wherein the stage number constraint has a higher priority than the signal transition probability.

4. A method for designing a path transistor logic circuit based on a logic specification of a given circuit, the method comprising the steps of:

generating a logic circuit including logic gates based on the logic specification, the logic circuit receiving input signals;

calculating, based on a delay time constraint defining allowable delay time between input/output signals of the given circuit and on an average delay time of the path transistor logic circuit, a stage number constraint defining an allowable number of stages of the path transistor logic circuit;

determining an order of input signals of the logic circuit for Shannon expansion in view of the stage number constraint;

generating a binary decision diagram corresponding to the logic circuit by applying Shannon expansion to the logic circuit in accordance with the determined order of input signals, the binary decision diagram including nodes; and replacing each of the nodes of the binary decision diagram with a two-input selector circuit so as to obtain the path transistor logic circuit.

5. A method for designing a path transistor logic circuit based on a logic specification of a given circuit, the method comprising the steps of:

generating a logic circuit including logic gates based on the logic specification, optimizing the logic circuit so as to eliminate redundant circuitry;

dividing the optimized logic circuit into a plurality of sub-circuits in view of the number of input signals to each of the sub-circuits;

determining an order of the input signals of each of the sub-circuits for Shannon expansion for purposes of minimizing a binary decision diagram to be generated;

generating a binary decision diagram corresponding to the logic circuit by applying Shannon expansion to each of the sub-circuits in accordance with the determined order of input signals, the binary decision diagram including nodes; and replacing each of the nodes of the binary decision diagram with a two-input selector circuit so as to obtain the path transistor logic circuit.

6. A method according to claim 5, further comprising the step of:

evaluating signal transition probability of each of the input signals of the respective sub-circuits, wherein the order of the input signals of each of the sub-circuits is determined based on the signal transition probability.

7. A method according to claim 5, further comprising the step of:

calculating, based on a delay time constraint defining allowable delay time between input/output signals of the given circuit and on an average delay time of the path transistor logic circuit, a stage number constraint defining an allowable number of stages of the path transistor logic circuit, wherein the order of the input signals of each of the sub-circuits is determined based on the stage number constraint.

8. A method according to claim 6, further comprising the step of:

calculating, based on a delay time constraint defining allowable delay time between input/output signals of the given circuit and on an average delay time of the path transistor logic circuit, a stage number constraint defining an allowable number of stages of the path transistor logic circuit, wherein the order of the input signals of each of the sub-circuits is determined based on the stage number constraint and the signal transition probability.

* * * * *